(12) United States Patent
Holland et al.

(10) Patent No.: US 6,598,615 B1
(45) Date of Patent: Jul. 29, 2003

(54) COMPACT INDEPENDENT PRESSURE CONTROL AND VACUUM ISOLATION FOR A TURBOMOLECULAR PUMPED PLASMA REACTION CHAMBER

(75) Inventors: John Holland, San Jose, CA (US); Michael Barnes, San Ramon, CA (US); Steve S. Y. Mak, Pleasanton, CA (US); Patrick Leahey, San Jose, CA (US); Jonathan D. Mohn, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/708,345

(22) Filed: Nov. 7, 2000

(51) Int. Cl.$^7$ .............................. C23C 16/50; F17D 1/18
(52) U.S. Cl. ............... 137/14; 137/565.23; 137/565.33; 118/723
(58) Field of Search .................. 118/723 E, 692, 118/720; 156/627, 345.26; 137/565.29, 14, 875, 565.23, 565.33

(56) References Cited

U.S. PATENT DOCUMENTS

| | | | | |
|---|---|---|---|---|
| 4,212,317 A | * | 7/1980 | Patrick et al. | 137/565 |
| 4,949,670 A | * | 8/1990 | Krogh | 118/723 E |
| 5,758,680 A | * | 6/1998 | Kaveh et al. | 137/14 |
| 6,041,817 A | | 3/2000 | Guertin | |
| 6,080,679 A | | 6/2000 | Suzuki | |
| 6,223,770 B1 | * | 5/2001 | Snow | 137/565.23 |

* cited by examiner

Primary Examiner—A. Michael Chambers
(74) Attorney, Agent, or Firm—Sughrue, Mion, Zinn, MacPeak & Seas; Joseph Bach

(57) ABSTRACT

A method and apparatus for use in conjunction with a plasma reaction chamber provide both throttling functionality and independent vacuum isolation for a turbomolecular pump. A throttle valve provides for precise reaction chamber pressure regulation, and a gate valve prevents extended exposure of the turbomolecular pump to atmospheric conditions during cleaning or other maintenance operations. The throttle valve and the gate valve may be actuated independently.

13 Claims, 3 Drawing Sheets

COMPACT INDEPENDENT PRESSURE CONTROL AND VACUUM ISOLATION FOR A TURBOMOLECULAR PUMPED PLASMA REACTION CHAMBER

BACKGROUND OF THE INVENTION

1. Field of the Invention

The present invention is related generally to exhaust systems for plasma reaction chambers, and more particularly to a system adapted both for throttling chamber pressure and flow and for isolating a turbomolecular pump, vacuum pump, or cryogenic pump port.

2. Description of the Related Art

Many process steps in the production of semiconductor wafers and other electronic or industrial components require the use of plasmas within a plasma reaction chamber. During use, such reaction chambers are typically maintained at low pressure through mechanical vacuum pumps, turbomolecular pumps, or some combination thereof, as is well known in the art.

Precise pressure control for maintaining high vacuum conditions in the reaction chamber is conventionally accomplished by throttling a turbomolecular pump through a valve assembly. Valve assemblies currently in use, however, do not provide for isolation of the turbomolecular pump independently from a low vacuum, or "roughing," pump during reaction chamber or valve assembly cleaning operations or other maintenance procedures. As a consequence, the turbomolecular pump employed in conventional systems may be exposed to atmospheric conditions, thereby exposing residual reaction chamber chemistries and by-products remaining in the pump to atmospheric water vapor and other contaminants. Such exposure of a turbomolecular pump to atmosphere during a reaction chamber cleaning process may introduce particulate contamination and cause chemical corrosion in the system, decreasing process efficiency and shortening the life of the pump.

There has been a continuing and growing need, therefore, for a method and apparatus capable of providing reaction chamber pressure control as well as enabling independent isolation of the turbomolecular pump such that the pump is not exposed to atmospheric conditions when other components of the system are undergoing maintenance operations.

SUMMARY OF THE INVENTION

The present invention overcomes the foregoing and other shortcomings of conventional valve assemblies used in conjunction with plasma reaction chambers in a method and apparatus which provide both throttling functionality as well as vacuum isolation for a turbomolecular pump. Briefly, the present invention prevents extended exposure of the turbomolecular pump to atmosphere, and allows faster reaction chamber recovery after cleaning.

The present reaction chamber design prefers combining the throttling pressure control function with the atmospheric isolation function to minimize pumping speed conductance losses within the reaction chamber as well as separating the pressure throttling and turbomolecular pump isolation functions to eliminate exposing chemical and polymer depositions deposited within the confines of the turbomolecular pump.

A throttle valve plate remains exposed to plasma and process chemistry, while a removable interface allows for easy off-line cleaning. A separate turbomolecular pump isolation plate is fully protected from process plasma and chemistry to preclude deposition from occurring on the isolation mechanism.

According to one aspect of the present invention, a method of exhausting a plasma reaction chamber includes throttling at least one exhaust pump at a throttle valve and providing for isolation of a turbomolecular pump independent of the operation of the throttle valve.

According to another aspect of the present invention, a valve assembly for use in conjunction with a plasma reaction chamber is generally constituted by an upstream port having an associated throttle valve, a high vacuum port having an associated gate valve, and a low vacuum port. The low vacuum port may be operable to evacuate the reaction chamber even when the gate valve closes the high vacuum port. Operation of the gate valve may be independent of the throttle valve.

According to another aspect of the present invention, a system including a plasma reaction chamber employs the inventive valve assembly.

The above-mentioned and other attendant advantages of the present invention will become more apparent upon examination of the following detailed description of the preferred embodiments thereof with reference to the attached drawings.

DETAILED DESCRIPTION OF THE PREFERRED EMBODIMENTS

Figure 1:
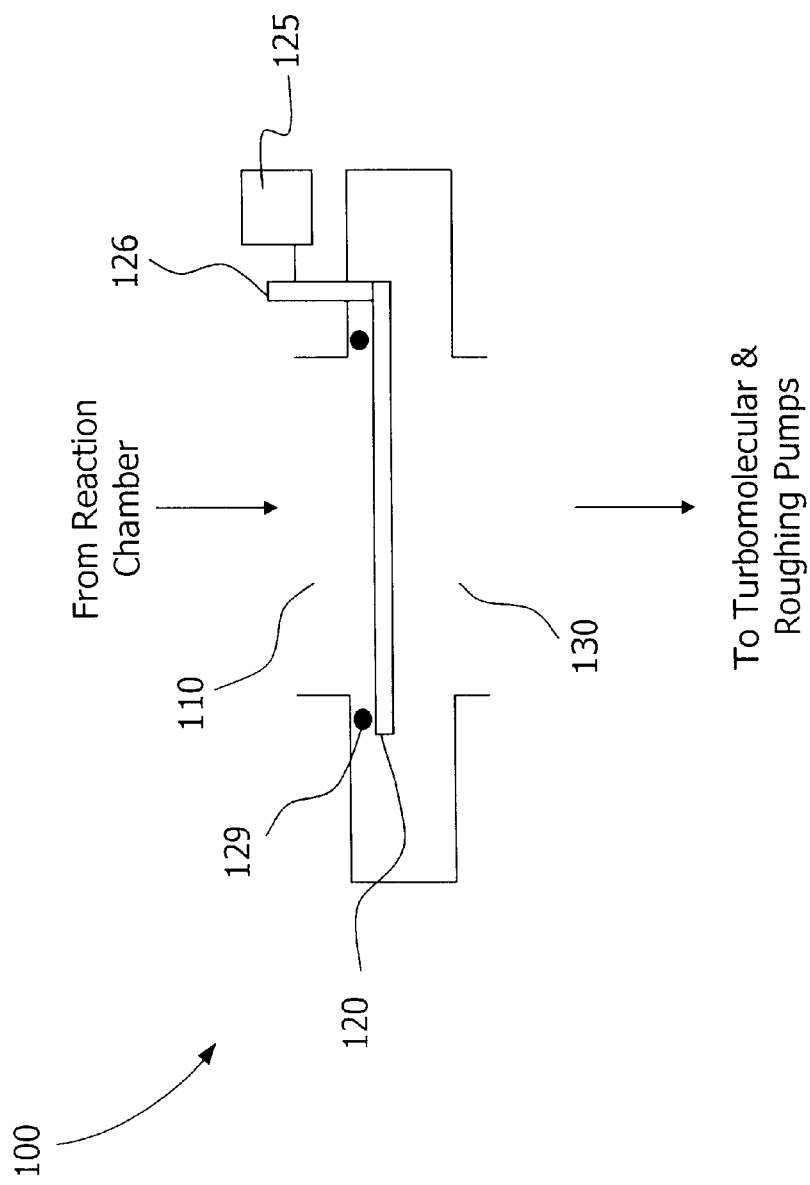
FIG. 1 is a simplified cross-sectional side view of a conventional valve assembly.

With reference now to the drawings, FIG. 1 is a simplified cross-sectional side view of a conventional pendulum-type valve assembly 100 presently used in plasma reaction chamber exhaust systems. An upstream port 110 is coupled to an exhaust manifold of a plasma reaction chamber (not shown). A downstream port 130 couples valve assembly 100 with one or more pumps (not shown) which provide low pressure for evacuating the reaction chamber. In a typical configuration, both a low vacuum mechanical pump (roughing pump) and a high vacuum turbomolecular pump (turbo pump) are provided. A single pendulum-type or slide-type valve 120 is provided through which the pumps may be throttled such that reaction chamber pressure may be regulated. In the case of a pendulum valve, a valve actuator 125 rotates an actuator shaft 126, pivoting valve 120 incrementally between an opened position and a closed position. In the closed position, valve 120 may engage seal 129 so as to isolate the pumps from the reaction chamber. The direction of mass flow through the overall system is indicated by the arrows in FIG. 1.

Two significant shortcomings are associated with the system illustrated in FIG. 1. First, during reaction chamber cleaning or maintenance processes, valve 120 may engage seal 129 so as to isolate the turbo pump from the reaction chamber; the roughing pump is also isolated, however, such that valve assembly 100 provides no exhaust for the reaction chamber during cleaning. When valve 120 is reopened, cleaning by-products deposited near upstream port 110 are unavoidably introduced to the turbo pump. Second, if valve 120 is not closed during reaction chamber cleaning, or when valve assembly 100 itself requires cleaning or maintenance, the turbo pump is exposed to atmosphere, since no independent vacuum isolation is provided.

Figure 2:
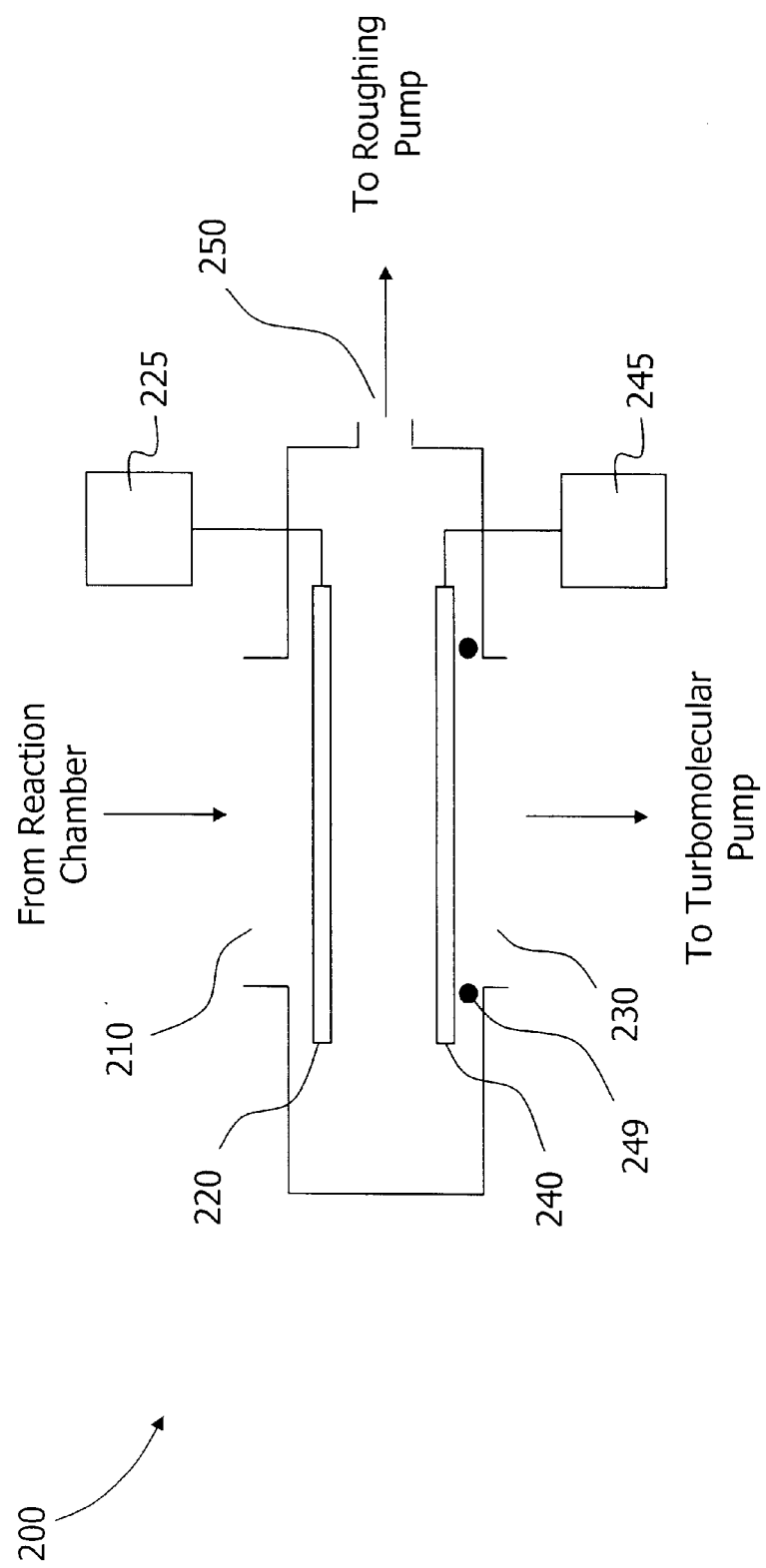
FIG. 2 is a simplified cross-sectional side view of one embodiment of a valve assembly constructed in accordance with the present invention.

FIG. 2 is a simplified cross-sectional side view of a valve assembly 200 constructed in accordance with the present invention. Valve assembly 200 is adapted to be interposed between a plasma reaction chamber (not shown) and one or more pumps (not shown) which provide vacuum pressure regulation for the reaction chamber. In the exemplary embodiment illustrated in FIG. 2, valve assembly 200 is interposed between a reaction chamber and a low vacuum roughing pump, and between a reaction chamber and a high vacuum turbo pump. Such an arrangement of valve assembly 200 relative to a reaction chamber and the pumps provides significant advantages over prior art configurations such as that illustrated in FIG. 1.

Specifically, in this unique arrangement, a throttle valve plate is directly exposed to process chemistry while the plate of an isolation valve, or gate valve, is not exposed to process chemistry. Both valve plates are, however, contained in the same vacuum feed through location or space.

As shown in FIG. 2, valve assembly 200 is generally constituted by an upstream port 210 having a throttle valve 220 associated therewith and a high vacuum port 230 having a gate valve 240 and a cooperating unidirectional vacuum seal 249 associated therewith; a low vacuum port 250 may be provided for coupling the plasma reaction chamber to a roughing pump through valve assembly 200. During use, gate valve 240 may be actuated under control of an independent gate valve actuator 245, and throttle valve 220 may be actuated under control of an independent throttle valve actuator 225; as a result, operation of gate valve 240 may be independent of operation of throttle valve 220. The relative positions of valve actuators 225 and 245 are illustrated by way of example only; various configurations are contemplated.

The various elements of valve assembly 200 may be constructed of any suitable metallic material common in the art, such as stainless steel, aluminum, anodized aluminum, and the like. Vacuum seal 249 may be constructed of material known in the art, selected so as to minimize deterioration of vacuum seal 249 resulting from exposure to process chemistries employed in the plasma reaction chamber.

Either one or both of throttle valve 220 and gate valve 240 may be of the pendulum-type, for example, such as illustrated in FIG. 1, so as to minimize the size and the mechanical complexity of valve assembly 200. Alternatively, either one or both of throttle valve 220 and gate valve 240 may be of the linear sliding plate variety. The structure and operation of pendulum and slide valves are well developed in the art; the mechanical details have been omitted from FIG. 2 for clarity.

Upstream port 210 is coupled to an exhaust manifold of the reaction chamber. During reaction chamber operation, throttle valve 220 may be opened under control of throttle valve actuator 225 and a roughing pump may be operated to expose the reaction chamber to a relatively low vacuum through low vacuum port 250. Mass is evacuated from the reaction chamber through upstream port 210, and exits valve assembly 200 through low vacuum port 250. When a low vacuum condition in the reaction chamber is reached, gate valve 240 may be opened under control of gate valve actuator 245, exposing the reaction chamber to a relatively high vacuum generated by operation of the turbo pump. Process exhaust gases are then evacuated from the reaction chamber through upstream port 210, and exit valve assembly 200 through high vacuum port 230. Precise regulation of reaction chamber pressure may be accomplished, for example, through incremental control of throttle valve 220. The direction of mass flow through the system is indicated by the arrows in FIG. 2.

As noted above, gate valve 240 may be independently closed under operation of gate valve actuator 245. When closed, gate valve 240 may engage unidirectional vacuum seal 249, thereby sealing high vacuum port 230; the turbo pump, therefore, may be isolated from the reaction chamber and valve assembly 200. Gate valve 240 may be maintained in the closed position through application of mechanical force, asserted for example, through gate valve actuator 245. Alternatively or additionally, the high vacuum condition created by the turbo pump may be used to retain gate valve 240 in the closed position against vacuum seal 249 through a pressure differential between the low pressure turbo pump side and the high pressure valve assembly 200 side of gate valve 240.

With gate valve 240 in the closed position, throttle valve 220 may be independently operable, for example to throttle the roughing pump during reaction chamber cleaning operations. This arrangement eliminates the need for a separate throttle or gate valve dedicated to the roughing pump. Additionally, either the reaction chamber or the remainder of valve assembly 200 (for example, at upstream port 210 or at low vacuum port 250) may be exposed to atmosphere during maintenance, while the turbo pump remains isolated by gate valve 240 and vacuum seal 249 at high vacuum port 230.

Though vacuum isolated by gate valve 240 during reaction chamber cleaning or other maintenance processes, the turbo pump may remain operating, for example, to provide the foregoing pressure differential to maintain gate valve 240 in the closed position. An additional valve assembly or other pressure regulation mechanism may be provided downstream of the turbo pump for enabling pressure control in the turbo pump while gate valve 240 is closed and the turbo pump remains operational. With such an arrangement, the turbo pump need be neither disabled nor otherwise powered down during isolation, for example, during maintenance of the other elements of the system; consequently, reaction chamber recovery times after cleaning may be substantially reduced, since delay while the turbo pump comes up to speed and temperature is avoided.

Figure 3:
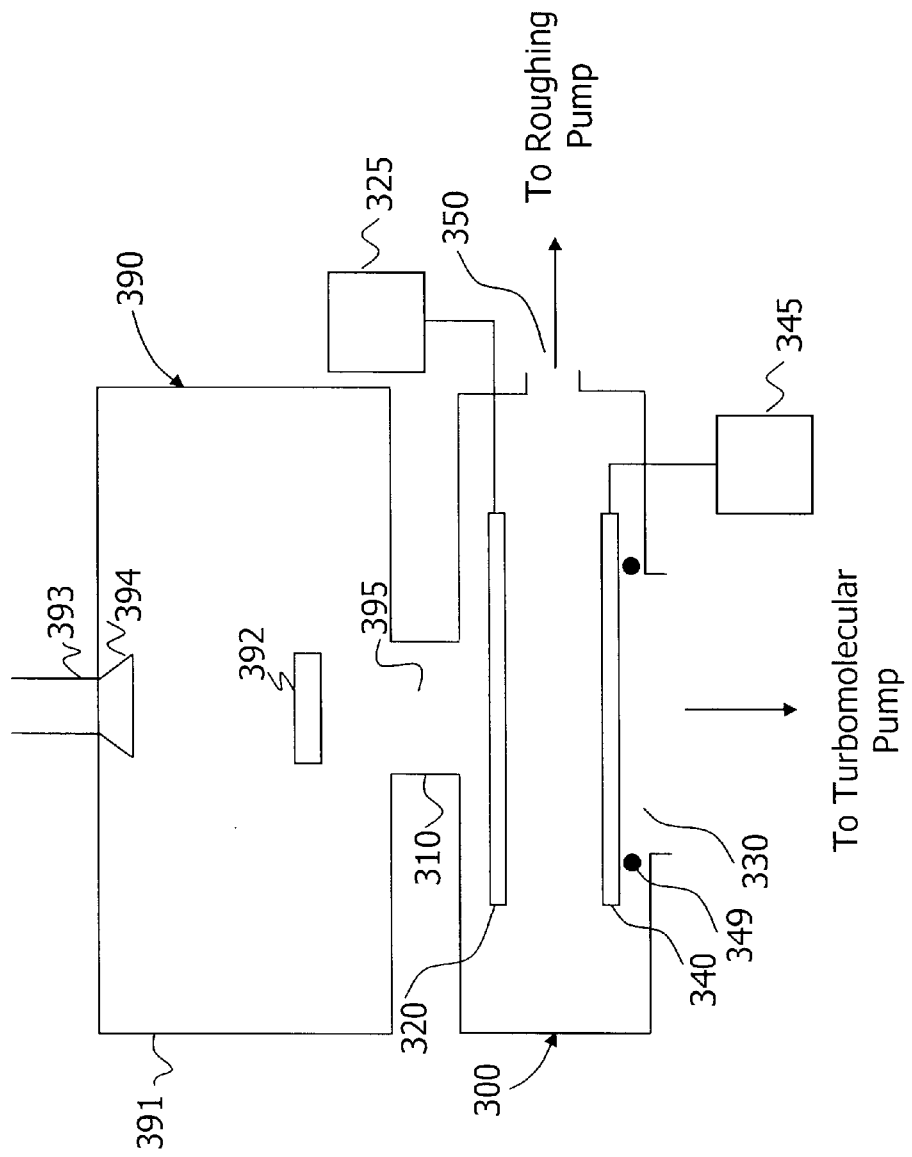
FIG. 3 is a simplified cross-sectional side view of one embodiment of a system in which the valve assembly of the present invention operates in conjunction with a plasma reaction chamber.

FIG. 3 is a simplified cross-sectional side view of one embodiment of a system in which the valve assembly 300 operates in conjunction with a plasma reaction chamber 390 requiring high vacuum conditions. The valve assembly 300 corresponds generally to valve assembly 200 illustrated in FIG. 2. In FIG. 3, valve assembly 300 is interposed between reaction chamber 390 and a low vacuum roughing pump (not shown), and between reaction chamber 390 and a high vacuum turbo pump (not shown).

It will be appreciated by those of skill in the art that reaction chamber 390 is generally constituted by a platform 392 for securing a wafer or other work piece at a desired location within reaction chamber 390. Process gases delivered through one or more lines such as gas line 393 are injected into process chamber 390 through a nozzle 394, for example, and are evacuated through exhaust 395. Process chambers as illustrated in FIG. 3 are known in the art.

Turning to valve assembly 300, the upstream port 310 is coupled to exhaust 395 of reaction chamber 390. In operation, the throttle valve 320 may be opened under control of the throttle valve actuator 325, and a roughing pump may be operated to expose the volume of process chamber 390 to a relatively low vacuum through the low vacuum port 350. Mass is evacuated from process chamber 390 through upstream port 310, and exits valve assembly 300 through low vacuum port 350. When a low vacuum condition in reaction chamber 390 is reached, the gate valve 340 may be opened under control of the gate valve actuator 345, exposing the volume of reaction chamber 390 to a relatively high vacuum generated by operation of the turbo pump. Process exhaust gases are then evacuated from reaction chamber 390 through upstream port 310, and exit valve assembly 300 through the high vacuum port 330. Precise regulation of reaction chamber pressure may be accomplished, for example, through incremental control of throttle valve 320.

As noted above, gate valve 340 may be independently closed under operation of gate valve actuator 345. When closed, gate valve 340 may engage unidirectional vacuum seal 349, for example, thereby sealing high vacuum port 330; the turbo pump, therefore, may be isolated from reaction chamber 390 and valve assembly 300. Gate valve 340 may be maintained in the closed position through application of mechanical force, asserted for example, through gate valve actuator 345. Alternatively or additionally, the high vacuum condition created by the turbo pump may be used to retain gate valve 340 in the closed position against vacuum seal 349 through a pressure differential between the low pressure turbo pump side and the high pressure valve assembly 300 side of gate valve 340.

In the embodiment illustrated in FIG. 3, the pressure throttling function is separated from the turbo pump isolation function through use of independently operable valves 320 and 340. The separation of throttling and isolation functions prevents exposing the turbo pump and its conduits to chemical and polymer depositions. The plate of throttle valve 320 remains exposed to plasma and reaction chamber chemistries, while the plate of the separate gate valve 340 fully protects the turbo pump from process plasma and chemistry, thereby precluding deposition from occurring on the isolated mechanism.

From the foregoing, it can be seen that the present invention provides efficient and compact reaction chamber pressure control as well as independent vacuum isolation of the turbo pump. The preferred embodiments disclosed herein have been described and illustrated by way of example only, and not by way of limitation. Other modifications and variations to the invention will be apparent to those skilled in the art from the foregoing detailed disclosure. While only certain embodiments of the invention have been specifically described herein, it will be apparent that numerous modifications may be made thereto without departing from the spirit and scope of the invention.

What is claimed is:

1. A method of exhausting a plasma reaction chamber, said method comprising:
    throttling at least one pump in communication with the exhaust of a plasma reaction chamber; and
    isolating at least one other pump in communication with the exhaust of a plasma reaction chamber independently of said throttling.

2. The method according to claim 1 wherein said throttling further comprises:
    regulating a pressure in said plasma reaction chamber.

3. The method according to claim 1 wherein said isolating further comprises:
    maintaining said at least one isolated pump in operation during said isolating.

4. A valve assembly for use in a plasma reaction chamber exhaust system, said valve assembly comprising:
    an upstream port for receiving an output of said reaction chamber;
    a low vacuum port for communicating a low vacuum pressure condition to said reaction chamber;
    a high vacuum port for communicating a high vacuum pressure condition to said reaction chamber;
    a throttle valve associated with said upstream port for regulating mass flow from said plasma reaction chamber; and
    a gate valve for sealing said high vacuum port.

5. The valve assembly according to claim 4 wherein said throttle valve and said gate valve are independently operable.

6. The valve assembly according to claim 4 wherein at least one of said throttle valve and said gate valve is a pendulum valve.

7. The valve assembly according to claim 4 wherein at least one of said throttle valve and said gate valve is a slide valve.

8. The valve assembly according to claim 4 wherein said throttle valve is operable to regulate mass flow through said low vacuum port when said gate valve seals said high vacuum port.

9. A system comprising:
    an upstream port for receiving an output of a plasma reaction chamber;
    a throttle valve for regulating mass flow from said plasma reaction chamber;
    a low vacuum port for communicating a low vacuum pressure condition to said reaction chamber;
    a high vacuum port for communicating a high vacuum pressure condition to said plasma reaction chamber; and
    a gate valve for sealing said high vacuum port.

10. The system according to claim 9 wherein said throttle valve and said gate valve are independently operable.

11. The system according to claim 9 wherein said throttle valve is operable to regulate mass flow from said plasma reaction chamber through said low vacuum port when said gate valve seals said high vacuum port.

12. The system according to claim 9 wherein at least one of said throttle valve and said gate valve is a pendulum valve.

13. The system according to claim 9 wherein at least one of said throttle valve and said gate valve is a slide valve.

* * * * *